(12) United States Patent
Vigraham et al.

(10) Patent No.: US 9,755,590 B2
(45) Date of Patent: Sep. 5, 2017

(54) CIRCUITS FOR LOW NOISE AMPLIFIERS

(71) Applicants: Baradwaj Vigraham, San Jose, CA (US); Peter R. Kinget, Summit, NJ (US)

(72) Inventors: Baradwaj Vigraham, San Jose, CA (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/107,863

(22) PCT Filed: Dec. 24, 2014

(86) PCT No.: PCT/US2014/072324
§ 371 (c)(1),
(2) Date: Jun. 23, 2016

(87) PCT Pub. No.: WO2015/100402
PCT Pub. Date: Jul. 2, 2015

(65) Prior Publication Data
US 2016/0322943 A1    Nov. 3, 2016

Related U.S. Application Data

(60) Provisional application No. 61/920,744, filed on Dec. 25, 2013.

(51) Int. Cl.
*H03F 3/193* (2006.01)
*H03H 11/28* (2006.01)
(Continued)

(52) U.S. Cl.
CPC ............. *H03F 3/193* (2013.01); *H03F 1/565* (2013.01); *H03F 3/19* (2013.01); *H03F 3/211* (2013.01);
(Continued)

(58) Field of Classification Search
CPC ..................................................... H03F 3/193
(Continued)

(56) References Cited

U.S. PATENT DOCUMENTS 3,879,688 A * 4/1975 Hayashi ............... H03G 1/0029
327/306
4,525,678 A * 6/1985 Lehmann ............... H03F 3/193
330/277
(Continued)

OTHER PUBLICATIONS

International Preliminary Report on Patentability dated Jul. 7, 2016 in International Patent Application No. PCT/US2014/072324.
(Continued)

*Primary Examiner* — Patricia T Nguyen
(74) *Attorney, Agent, or Firm* — Byrne Poh LLP

(57) ABSTRACT

Low noise amplifiers (LNAs) are provided, the LNAs comprising: a common gate matching network; a capacitor$_d$; a resistor$_d$; a coil$_d$, wherein a side$_1$ of coil$_d$ is coupled to a side$_1$ of capacitor$_d$, a side$_1$ of resistor$_d$, and a V+ and a side$_2$ of the coil$_d$ is coupled to a side$_2$ of capacitor$_d$, a side$_2$ of resistor$_d$, and a network input; a capacitor$_s$; a resistor$_s$; a coil$_s$, wherein a side$_1$ of coil$_s$ is coupled to an LNA input, a side$_1$ of capacitor$_s$, a side$_1$ of resistor$_s$, and a network output and a side$_2$ of coil$_s$ is coupled to a side$_2$ of the capacitor$_s$, a side$_2$ of resistor$_s$, and ground; and an output coil that is magnetically coupled to coil$_d$ and coil$_s$ and having a side$_1$ coupled to a first terminal of an LNA output and a side$_2$ coupled to a second terminal of the LNA output.

12 Claims, 5 Drawing Sheets

(51) Int. Cl.
  *H03F 1/56* (2006.01)
  *H03F 3/19* (2006.01)
  *H03F 3/21* (2006.01)

(52) U.S. Cl.
  CPC ....... *H03H 11/28* (2013.01); *H03F 2200/222* (2013.01); *H03F 2200/294* (2013.01); *H03F 2200/541* (2013.01); *H03F 2200/78* (2013.01)

(58) Field of Classification Search
  USPC .................................................... 330/277
  See application file for complete search history.

(56) References Cited

U.S. PATENT DOCUMENTS

| | | |
|---|---|---|
| 8,102,213 B2 | 1/2012 | Tasic et al. |
| 8,310,309 B2 | 11/2012 | Behera et al. |
| 2006/0079194 A1 | 4/2006 | Tired et al. |
| 2007/0075779 A1 | 4/2007 | Hajimiri et al. |
| 2009/0075597 A1 | 3/2009 | Degani et al. |
| 2009/0102552 A1* | 4/2009 | Shiramizu ............... H03F 1/342 330/98 |
| 2009/0195316 A1* | 8/2009 | Park ........................ H03F 3/193 330/277 |
| 2010/0259331 A1 | 10/2010 | Duster et al. |
| 2013/0222060 A1 | 8/2013 | Lo et al. |
| 2014/0097894 A1* | 4/2014 | Soe ........................ H03D 7/125 330/188 |

OTHER PUBLICATIONS

International Search Report and Written Opinion of the International Search Authority dated Apr. 22, 2015 in International Patent Application No. PCT/US/2014/072324.

Kihara et al., "A 1.0 V, 2.5 mW, Transformer Noise-Canceling UWB CMOS LNA", In Radio Frequency Integrated Circuits Symposium, Atlanta, Georgia, Jun. 17-Apr. 17, 2008, pp. 493-496.

* cited by examiner

CIRCUITS FOR LOW NOISE AMPLIFIERS

CROSS REFERENCE TO RELATED APPLICATION

This application claims the benefit of U.S. Provisional Patent Application No. 61/920,744, filed Dec. 25, 2013, which is hereby incorporated by reference herein in its entirety.

STATEMENT REGARDING GOVERNMENT FUNDED RESEARCH

This invention was made with government support under grant CCF-0964497 awarded by the National Science Foundation. The government has certain rights in the invention.

BACKGROUND

Low Noise Amplifiers (LNAs) are an integral part of many high performance receivers and their design in the literature with noise figures <3 dB has typically been limited to the use of source-degenerated LNAs and noise-cancelling LNAs. While the former provide impressive noise figure numbers using two to three integrated inductors in a CMOS technology, they suffer from degraded linearity from the passive gain in the input matching network. Noise-cancelling LNAs, on the other hand, typically achieve comparable noise figures with linearity, albeit at the cost of dramatically high power consumption spent in realizing the noise-cancelling network by active means.

FIG. 1 shows an example 100 of a typical block diagram of a noise cancelling LNA circuit using a "common-gate (CG) matching network." As illustrated, circuit 100 may include a common gate matching network 108, a drain resistor $R_d$ 114, a source resistor $R_s$ 116, a first amplifier 120, a second amplifier 118, and an adder 122.

As also shown in FIG. 1, any suitable antenna/source 102 can provide an input signal to the LNA circuit, and antenna/source 102 may be represented as a voltage source 104 and an output resistance 106.

As used herein, the term "common-gate matching network" refers to the broad class of LNAs using a common gate input stage with or without gain boosting at the gate.

The noise from the CG matching network can be modeled as a current source ($i_n$) 124 as shown in FIG. 1. It can be shown that the transfer function of $i_n$ has a null when the gains $A_1$ of amplifier 120 and $A_2$ of amplifier 118 are related as $A_1/A_2 = a(1+R_0/R_s)/(1-R_0/R_s)$, where a is the gain of the CG matching network and, when the LNA is matched to its input, $a = R_d(1-R_0/R_s)/R_s$. The realization of the gains $A_1$ and $A_2$ is typically done by active means and hence the noise and distortion characteristics of the LNA are ultimately limited by the linearity and noise of the amplifiers, $A_1$ and $A_2$.

SUMMARY

Circuits for low noise amplifiers are provided. In some embodiments, low noise amplifiers (LNAs) having an LNA input and an LNA output are provided, the LNAs comprising: a common gate matching network having a network input and a network output; a drain capacitor having a first side and a second side; a drain resistor having a first side and a second side; a drain coil having a first side and a second side, wherein the first side of the drain coil is coupled to the first side of the drain capacitor, the first side of the drain resistor, and a positive supply voltage and the second side of the drain coil is coupled to the second side of the drain capacitor, the second side of the drain resistor, and the network input; a source capacitor having a first side and a second side; a source resistor having a first side and a second side; a source coil having a first side and a second side, wherein the first side of the source coil is coupled to the LNA input, the first side of the source capacitor, the first side of the source resistor, and the network output and the second side of the source coil is coupled to the second side of the source capacitor, the second side of the source resistor, and a supply voltage ground; and an output coil that is magnetically coupled to the drain coil and the source coil and having a first side coupled to a first terminal of the LNA output and a second side coupled to a second terminal of the LNA output.

DETAILED DESCRIPTION

Figure 1:
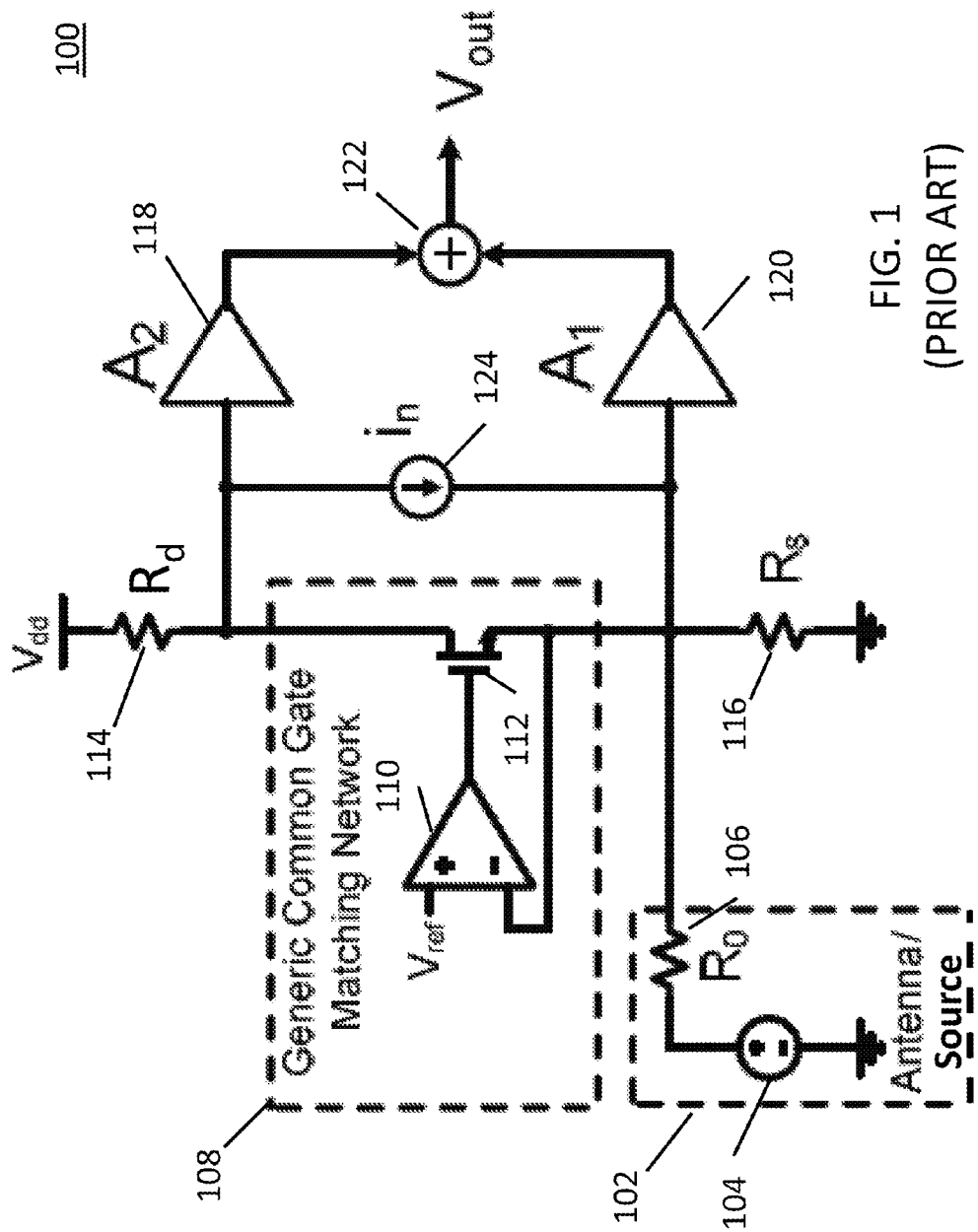
FIG. 1 shows an example of a typical block diagram of a noise cancelling low noise amplifier circuit using a "common-gate (CG) matching network" in accordance with the prior art.
Figure 2:
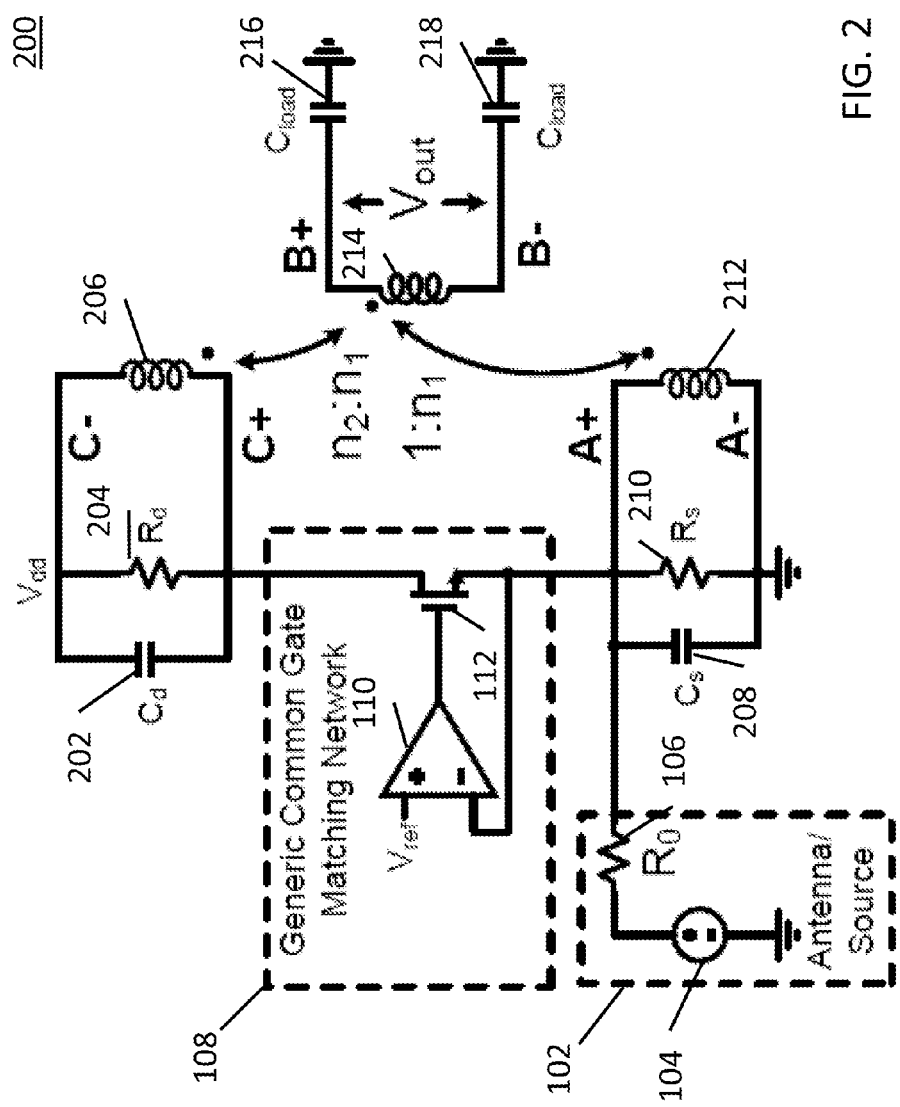
FIG. 2 shows an example of a low noise amplifier using passive voltage gain and summation in accordance with some embodiments.

FIG. 2 shows an example 200 of a low noise amplifier (LNA) circuit using passive voltage gain and summation in accordance with some embodiments. As shown, circuit 200 includes a common-gate (CG) matching network 108, a drain capacitor 202, a drain resistor 204, a drain coil 206, a source capacitor 208, a source resistor 210, a source coil 212, and an output coil 214.

As also shown in FIG. 2, any suitable antenna/source 102 can provide an input signal to the LNA circuit, and antenna/source 102 may be represented as a voltage source 104 and an output resistance 106.

As further shown in FIG. 2, the output of LNA circuit 200 can be represented by $V_{out}$, which is provided at a load connected to output coil 214. This load can be represented by load capacitors 216 and 218 and can provide a high impedance load on the coil.

Common-gate (CG) matching network 108 as shown in circuit 200 can be any suitable CG matching network and can have any suitable components.

Drain capacitor 202, drain resistor 204, source capacitor 208, and source resistor 210 can be any suitable capacitors and resistors, and these components can have any suitable values.

Coils 206, 212, and 214 can be magnetically coupled to form a transformer. This transformer can passively provide the voltage gain and summation of active amplifiers without adding the corresponding noise. Any suitable coils can be used in some embodiments. For example, in some embodiments, coils 206 and 214 form a transformer with turns ratio $n_2:n_1$ and coils 212 and 214 form a transformer with turns ratio $1:n_1$.

In some embodiments, by labeling coils 212, 206, and 214 as $L_s$, $L_d$, and $L_{out}$, respectively, the overall gain desired from the LNA as G, and the center frequency of the LNA as f, the following equations can be used to determine values for the corresponding components:

$$L_{out} = n_1^2 L_s$$

$$L_d = n_2^2 L_s$$

$$n_2 = R_d(1 + R_0/R_s)/R_s$$

$$C_d = -0.5(n_1^2/n_2^2)C_{load} + 1/(4\pi^2 f^2 L_d)$$

$$C_s = -0.5 n_1^2 C_{load} + 1/(4\pi^2 f^2 L_s)$$

$$n_1 = G/2$$

Figure 3:
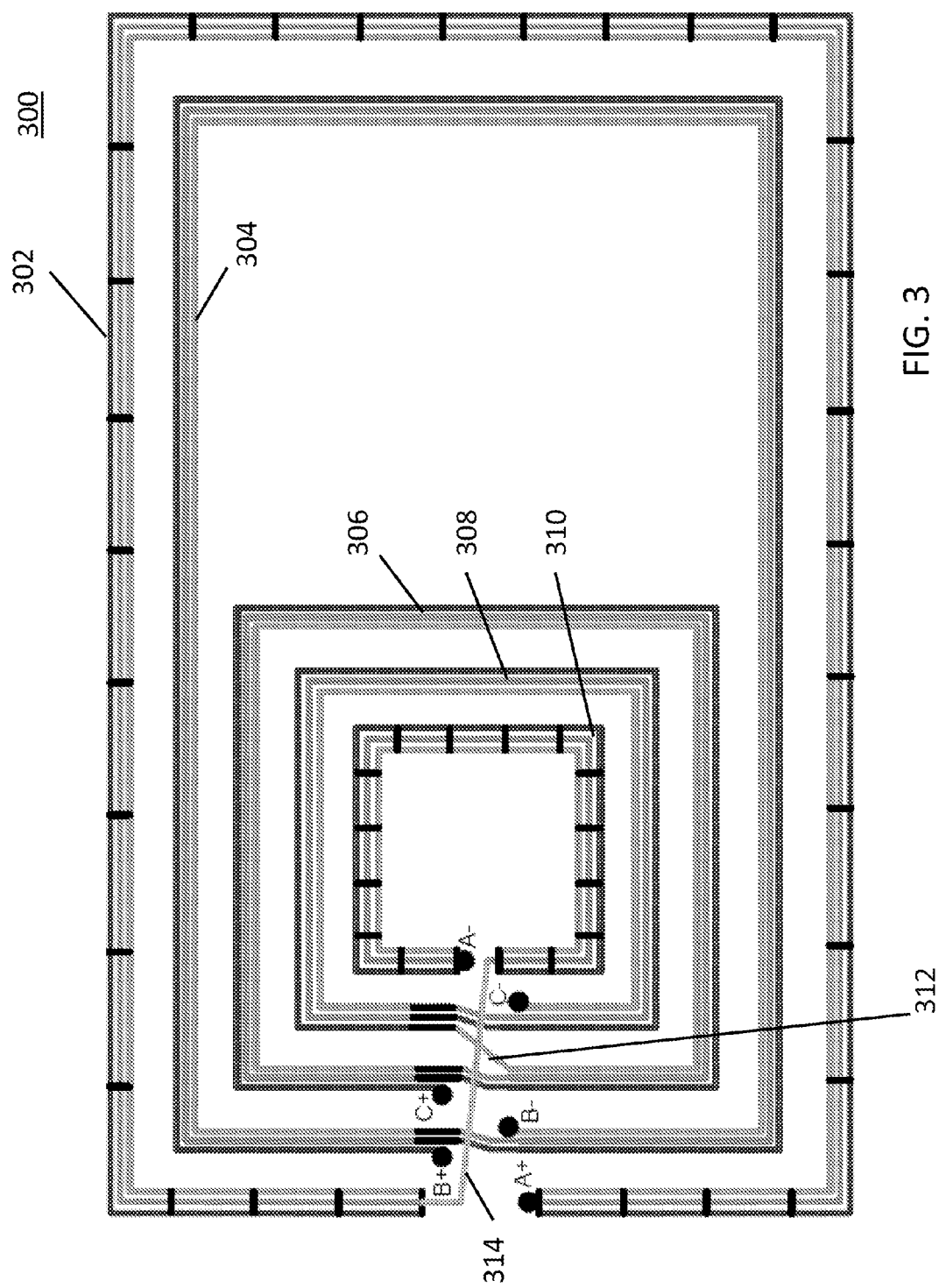
FIG. 3 shows a plan view of coils that can be used in a low noise amplifier using passive voltage gain and summation in accordance with some embodiments.

FIG. 3 shows a plan, layout view of three magnetically coupled coils that can be used with the circuit of FIG. 2 in accordance with some embodiments. As shown, the coils of FIG. 3 can connect to the circuit of FIG. 2 via the terminals identified in each as A+, A−, B+, B−, C+, and C−. As also shown, the coils can be formed from five loops 302, 304, 306, 308, and 310. That is coil 206 can be formed by loops 306 and 308 and connection 314, coil 212 can be formed by loops 302 and 310 and connection 312, and coil 214 can be formed by loop 304.

Figure 4:
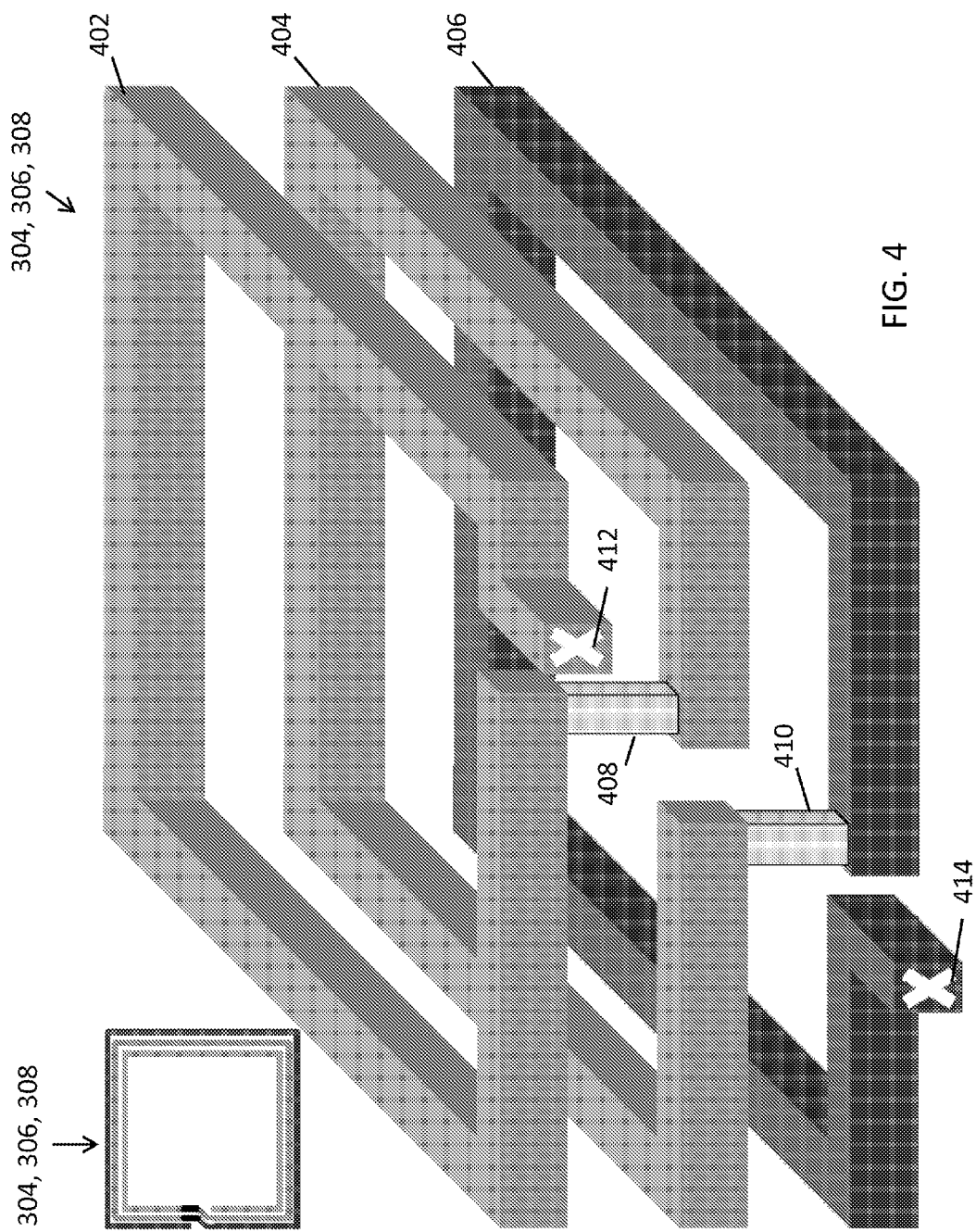
FIG. 4 shows a perspective view of some coils that can be used in a low noise amplifier using passive voltage gain and summation in accordance with some embodiments.

FIG. 4 shows a perspective view of an example of loops 304, 306, and 308 in accordance with some embodiments. As illustrated, these loops can be formed in a semi-conductor wafer in three metalization layers. More particularly, for example, a partial loop 402 can be formed in an upper metalization layer, a partial loop 404 can be formed in a middle metalization layer, and a partial loop 406 can be formed in a lower metalization layer. These partial loops can be connected together by links 408 and 410 to form a coil. The coil can be connected to other components via connections 412 and 414.

Figure 5:
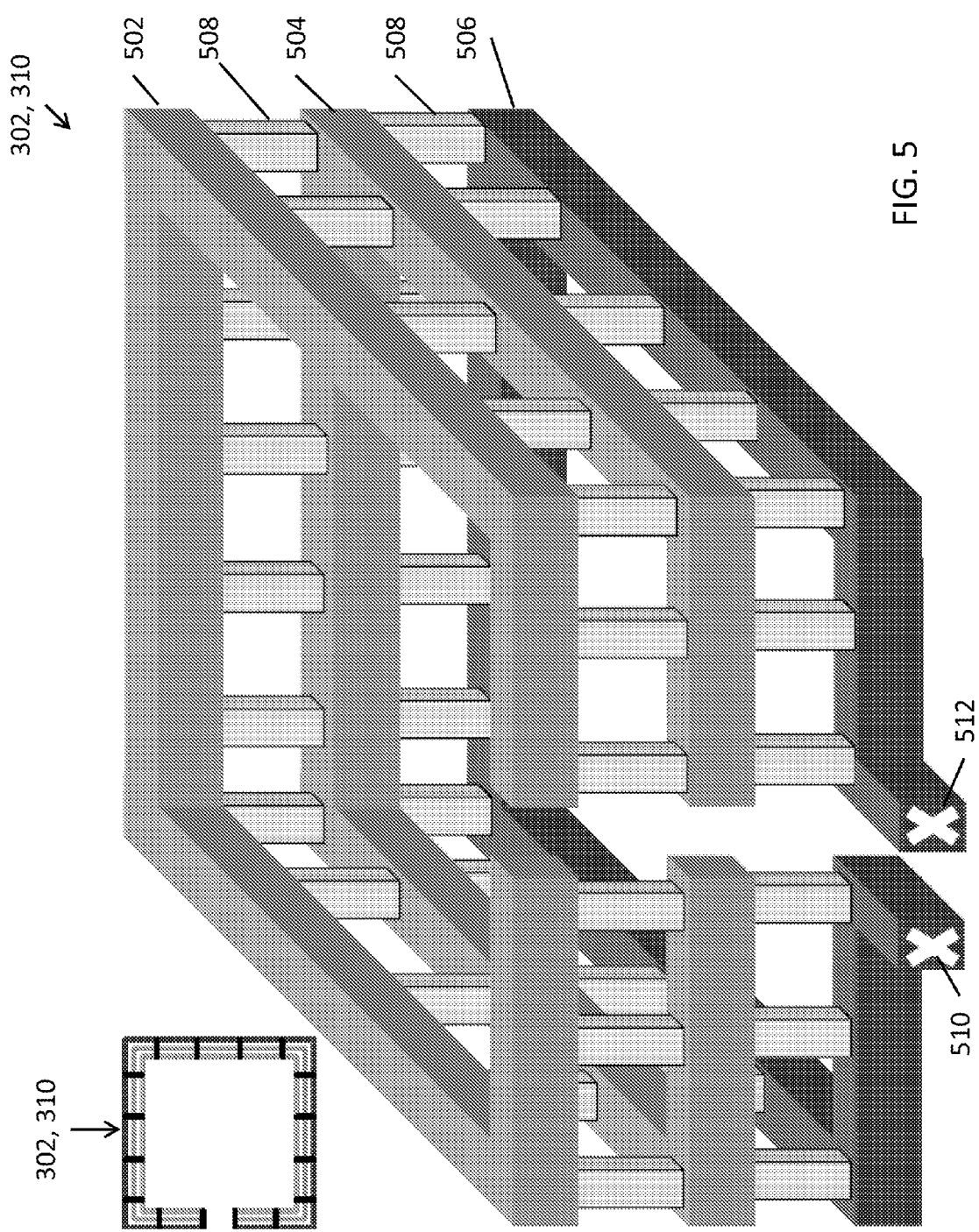
FIG. 5 shows a perspective view of other coils that can be used in a low noise amplifier using passive voltage gain and summation in accordance with some embodiments.

FIG. 5 shows a perspective view of an example of loops 302 and 310 in accordance with some embodiments. As illustrated, these loops can be formed in a semi-conductor wafer in three metalization layers. More particularly, for example, a partial loop 502 can be formed in an upper metalization layer, a partial loop 504 can be formed in a middle metalization layer, and a partial loop 506 can be formed in a lower metalization layer. These partial loops can be connected together by vias 508 to form a coil. Any suitable number of vias 508 can be provide between the partial loops. For example, eight vias can be provided in some embodiments, and these vias may be equally spaced along the length of the partial loops. The coil can be connected to other components via connections 510 and 512.

Although the examples provided herein use transformers to provide a passive gain, any suitable components can be used to provide passive gains in some embodiments. For example, other uses of coils and capacitors can be used in some embodiments.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A low noise amplifier (LNA) having an LNA input and an LNA output, comprising:
a common gate matching network having a network input and a network output;
a drain capacitor having a first side and a second side;
a drain resistor having a first side and a second side;
a drain coil having a first side and a second side, wherein the first side of the drain coil is coupled to the first side of the drain capacitor, the first side of the drain resistor, and a positive supply voltage and the second side of the drain coil is coupled to the second side of the drain capacitor, the second side of the drain resistor, and the network input;
a source capacitor having a first side and a second side;
a source resistor having a first side and a second side;
a source coil having a first side and a second side, wherein the first side of the source coil is coupled to the LNA input, the first side of the source capacitor, the first side of the source resistor, and the network output and the second side of the source coil is coupled to the second side of the source capacitor, the second side of the source resistor, and a supply voltage ground; and
an output coil that is magnetically coupled to the drain coil and the source coil and having a first side coupled to a first terminal of the LNA output and a second side coupled to a second terminal of the LNA output.

2. The LNA of claim 1, wherein the source coil and the output coil form a transformer with turns ratio 1:n1 and the drain coil and the output coil form a transformer with turns ratio n2:n1.

3. The LNA of claim 1, wherein the drain coil is formed from two coils connected in series.

4. The LNA of claim 3, wherein each of the two coils is formed over at least three layers of a semiconductor wafer using a partial loop in each of the at least three layers and a connection between each adjacent pair of the at least three layers that connects which connects the each partial loop in series.

5. The LNA of claim 4, wherein each of the partial loops is square.

6. The LNA of claim 1, wherein the output coil is formed over at least three layers of a semiconductor wafer using a partial loop in each of the at least three layers and a connection between each adjacent pair of the at least three layers that connects which connects the each partial loop in series.

7. The LNA of claim 6, wherein each partial loop is rectangular.

8. The LNA of claim 1, wherein the source coil is formed from two partial loops connected in series.

9. The LNA of claim 8, wherein each of the two partial loops is formed over at least three layers of a semiconductor wafer using a partial loop in each of the at least three layers and a plurality of connections between each adjacent pair of the at least three layers that connects which connects the each partial loop in parallel.

10. The LNA of claim 8, wherein one of the two partial loops is rectangular.

11. The LNA of claim 8, wherein one of the two partial loops is square.

12. The LNA of claim 1, wherein the common gate matching network comprises:

an operational amplifier with a first input coupled to a reference voltage, a second input, and an output; and a field effect transistor having a gate connected to the output of the operation amplifier, an drain connected to the network input, and a source connected to the network output and the second input of the operational amplifier.

* * * * *

UNITED STATES PATENT AND TRADEMARK OFFICE
CERTIFICATE OF CORRECTION

PATENT NO. : 9,755,590 B2
APPLICATION NO. : 15/107863
DATED : September 5, 2017
INVENTOR(S) : Baradwaj Vigraham et al.

Page 1 of 1

It is certified that error appears in the above-identified patent and that said Letters Patent is hereby corrected as shown below:

In the Specification

Column 1 Line 14-15 STATEMENT REGARDING GOVERNMENT FUNDED RESEARCH, "grant CCF-0964497" should be -- grant 0964497 --.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*